United States Patent [19]

Miyamoto

[11] E Re. 30,839

[45] Reissued Dec. 29, 1981

[54] MONOSTABLE MULTIVIBRATOR

[75] Inventor: Yukihiko Miyamoto, Tokyo, Japan

[73] Assignee: Trio Kabushiki Kaisha, Tokyo, Japan

[21] Appl. No.: 119,659

[22] Filed: Feb. 8, 1980

Related U.S. Patent Documents

Reissue of:

[64] Patent No.: 4,140,928
Issued: Feb. 20, 1979
Appl. No.: 806,102
Filed: Jun. 13, 1977

[30] Foreign Application Priority Data

Jun. 14, 1976 [JP] Japan ..... 51-69606

[51] Int. Cl.[3] ..... H03K 3/284

[52] U.S. Cl. ..... 307/273; 307/265; 307/491; 307/494; 330/261

[58] Field of Search ..... 307/273, 265, 230; 330/261

[56] References Cited

U.S. PATENT DOCUMENTS

| | | | |
|---|---|---|---|
| 2,976,432 | 3/1961 | Geckle | 307/273 |
| 2,987,632 | 6/1961 | Milford | 307/273 X |
| 3,124,706 | 3/1964 | Alexander | 307/273 X |
| 3,349,251 | 10/1967 | Wilder | 307/273 X |
| 3,883,756 | 5/1975 | Dragon | 307/273 X |

*Primary Examiner*—John S. Heyman
*Attorney, Agent, or Firm*—Kenway & Jenney

[57] ABSTRACT

A monostable multivibrator including a gate circuit, a time constant circuit, and an inverter circuit. An input signal to the gate circuit causes the time constant circuit which preferably includes a resistor and a capacitor to charge or discharge. A signal derived from the time constant circuit is applied to an input bias circuit including an emitter follower type transistor circuit associated with a differential amplifier within the inverter circuit to control the duration of the monostable output pulse.

7 Claims, 4 Drawing Figures

MONOSTABLE MULTIVIBRATOR

Matter enclosed in heavy brackets [ ] appears in the original patent but forms no part of this reissue specification; matter printed in italics indicates the additions made by reissue.

BACKGROUND OF THE INVENTION

The present invention relates to a multivibrator and, more particularly, to a multivibrator which is useful for a pulse count type FM demodulation circuit.

The well known pulse count type FM demodulation circuit operates by producing pulses each having a fixed width and being synchronized in phase with each period of the signal to be demodulated, and by integrating the pulses. The fixed width pulses may be produced by first wave-shaping the signal to be demodulated in an amplitude limiter and then applying that wave-shaped signal to a differentiating circuit which converts it into negative or positive going pulse signals. Use of pulse signals obtained in this manner, however, results in poor detection efficiency and thus, a poor signal to noise ratio. To overcome such disadvantages, a monostable multivibrator may be used to expand the pulse width. In superheterodyne receivers, it is necessary to carefully tune the received signal so that it will be centered in the frequency band of the band-pass filter used in the intermediate frequency amplifying stage to most effectively minimize signal distortion. Most receivers of this type are provided with tuning meters to permit easy selection of the appropriate tuning point. A DC output signal from the FM demodulation circuit is typically used to drive the tuning meter to indicate the signal tuning point. When the DC output signal of the demodulation circuit drifts due, for example, to a change in the power source voltage or the temperature, the tuning meter incorrectly indicates the tuning point. The pulse count type FM demodulation circuit is capable of excellent linearity but conventional monostable multivibrators used in such circuits are very sensitive to temperature variations. Accordingly, such DC output signals from the circuits may change with the temperature variation, thus providing incorrect signal tuning indications, resulting in incorrect tuning. When this happens, there is adverse signal distortion.

SUMMARY OF THE INVENTION

Accordingly, an object of the present invention is to provide a monostable multivibrator producing pulses each having a fixed pulse width which is independent of temperature variations.

Another object of the present invention is to provide a monostable multivibrator producing pulses each having a fixed pulse width which is independent of variations in the power source voltage.

Still another object of the present invention is to provide a monostable multivibrator adapted to be used with a pulse count type FM demodulation circuit.

The monostable multivibrator according to the present invention has a gate circuit, a time constant circuit, and an inverter circuit. The inverter circuit comprises a differential amplifier, the input bias circuit of which includes an emitter follower type transistor circuit.

Other objects and features of the present invention will be apparent from the following description taken in connection with the accompanying drawings.

DETAILED DESCRIPTION OF PREFERRED EMBODIMENT

Figure 1:
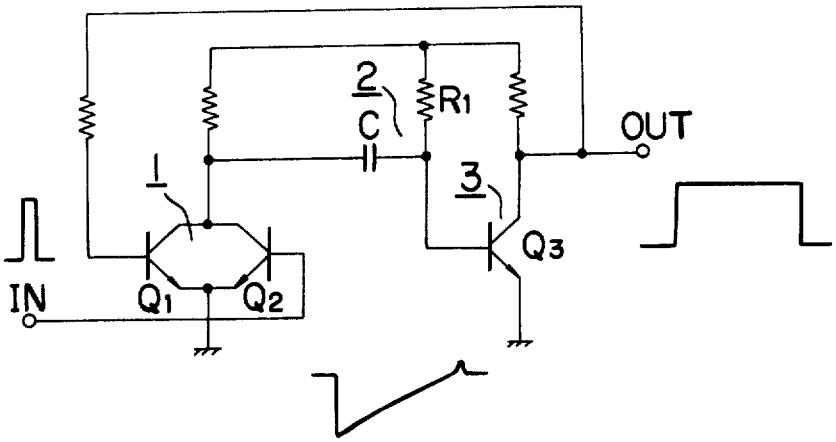
FIG. 1 (Prior Art)
FIGS. 1 and 2 are circuit diagrams showing conventional multivibrators; [and]
Figure 2:
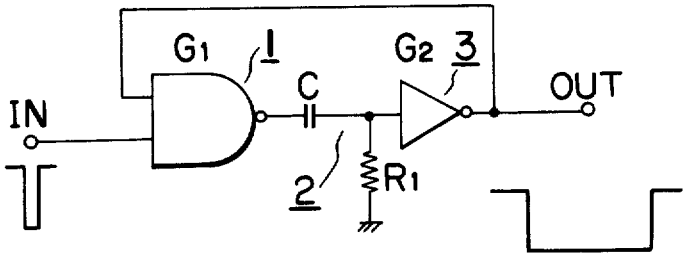
FIG. 2 (Prior Art)

Before proceeding with the description of the present invention, it will be helpful to briefly consider the conventional monostable multivibrators of FIGS. 1 and 2. As shown in FIG. 1, a monostable multivibrator comprises a gate circuit 1 having two transistors $Q_1$ and $Q_2$ with the collectors thereof connected together, a time constant circuit 2 including a capacitor C and a resistor $R_1$, and an inverter circuit 3 including a transistor $Q_3$. A trigger pulse is applied to the base of the transistor $Q_2$, thereby causing an output pulse to be produced at the collector of the transistor $Q_3$. The conventional monostable multivibrator circuit in FIG. 2, on the other hand, uses, a NAND gate $G_1$ and an inverter $G_2$ which, for example, may be conventional TTL (transistor-transistor logic *elements*). NAND gate [G1] $G_1$ and inverter [G2] $G_2$ in FIG. 2 correspond, respectively, to the gate circuit 1, and the inverter circuit *3* of FIG. 1.

These conventional multivibrator circuits are deficient in that the pulse width of the output pulse changes with [the] temperature. This problem[,] exists even if the elements C and [R1] $R_1$ of the time constant circuit 2 are kept substantially constant, for example, by the use of low drift mica capacitors and metallic resistors. This occurs because the threshold level of the inverter circuit 3 depends on temperature because $V_{BE}$ of the transistor $Q_3$ of FIG. 1, and the threshold level of the inverter $G_2$ in [the] FIG. 2 change with [temperate] *temperature*. The change of the threshold level of the inverter circuit 3 may be attributed to the fact that the amount of charge stored in a capacitor in a differentiator circuit is a function of the voltage applied across the capacitor.

The inverter circuits used in monostable multivibrators such as in FIGS. 1 and 2 ideally should have an input resistance value of zero (0) Ohms in the steady state and infinity ($\infty$) Ohms when inverting pulses. This can cause difficulties when the intervals between adjacent pulses become too narrow but the transistor inverter switch $Q_3$ in FIG. 1 and the TTL inverter element $G_2$ shown in FIG. 2 satisfy the input resistance value requirement quite well.

The inverter circuits 3 shown in FIGS. 1 and 2 are operated so that the [emitter-collector] *collector-emitter* circuit of the transistor is saturated and the associated [the] carrier storage time[,] thereby causes a delay in the output signal from the inverter. The amount of delay [on temperature variation] is a function of temperature according to the device electronics of the circuit elements (e.g., transistors). Thus, the pulse width of the output pulse of the multivibrator provided by the inverter 3 changes with temperature.

The pulse width of the output pulse of the monostable multivibrators of FIGS. 1 and 2 is approximately equal to the sum of the time constant determined by the time constant circuit 2 and the threshold level of the inverter circuit 3, and of the delay time associated with the inverter circuit 3. The pulse width, therefore, varies with temperature.

Figure 3:
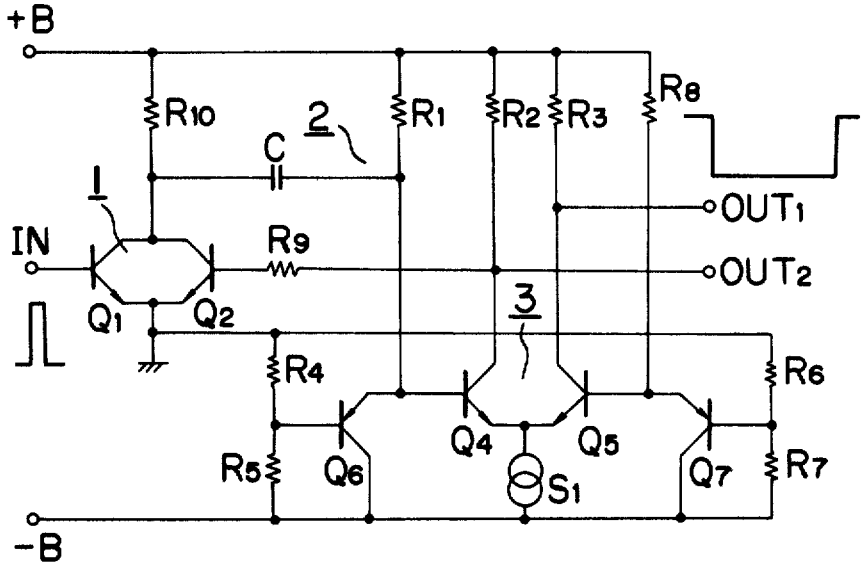
FIG. 3 is a circuit diagram showing an embodiment of a monostable multivibrator according to the present invention [.]; *and*
Figure 4:
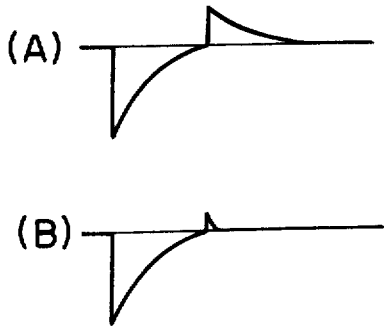
FIG. 4 is a waveform diagram showing certain waveforms occurring in the circuit of FIG. 3.

A monostable multivibrator according to the present invention is shown in FIG. 3 having an input terminal IN, a gate circuit 1, a time constant circuit 2 and an inverter circuit 3. $OUT_1$ and $OUT_2$ designate output terminals. The gate circuit 1 comprises a pair of transistors $Q_1$ and $Q_2$, the collectors of which are connected together and the emitters of which also are connected together. The common collectors are connected to +B power source through a resistor $R_{10}$ and the emitters are grounded. The base of the transistor $Q_1$ is connected to the input terminal IN. The time constant circuit 2 comprises a capacitor C and a resistor $R_1$. The capacitor C is connected at one end to the common collectors of the transistors $Q_1$ and $Q_2$ and at the other end to the resistor $R_1$. The resistor $R_1$ is connected at one end to the +B power source. The inverter circuit 3 comprises a differential amplifier including transistors $Q_4$ and $Q_5$. The emitters of the transistors $Q_4$ and $Q_5$ are connected together and also connected to a constant current source $S_1$. The collectors of transistors $Q_4$ and $Q_5$ are connected to the +B power source through resistors $R_2$ and $R_3$, respectively. The base of the transistor $Q_4$ is connected to the connection point of the capacitor C and the resistor $R_1$ and to the emitter of the transistor $Q_6$. The base of the transistor $Q_6$ is connected to the connection point of resistors $R_4$ and $R_5$ which are connected in series fashion between ground and a −B power source. The collector of the transistor $Q_6$ is connected to the −B power source. With this circuit arrangement, the transistor $Q_6$ operates as an emitter follower to apply a bias voltage to the base of the transistor $Q_4$. The base of the transistor $Q_5$ is connected to the connection point of a resistor $R_8$ and the emitter of the transistor $Q_7$. The transistor $Q_7$ is biased by the voltage divided by resistors $R_6$ and $R_7$. The transistor $Q_7$ also operates as an emitter follower similar to the transistor $Q_6$, and provides a bias voltage to the base of the transistor $Q_5$. The resistance values of the resistors $R_4$ to $R_7$ are appropriately selected so that the base potential of the transistor $Q_4$ is higher than that of the transistor $Q_5$ in a normal condition. The output signal [OUT 2 from the inverter circuit 3 provided] at the collector of the transistor $Q_4$ [and is also applied] *is applied* to the base of the transistor $Q_2$ of the gate circuit 1 through a resistor $R_9$.

The inverter circuit 3 of FIG. 3, therefore, includes, in effect, a differential amplifier circuit including transistors $Q_4$ and $Q_5$. Accordingly, the influence of the temperature change on the base-emitter voltages is very closely the same for both of the transistors $Q_4$ and $Q_5$, as well as for the transistors $Q_6$ and $Q_7$. This circuit arrangement, therefore, minimizes the variation of the threshold level of the inverter because the effects of temperature variation tend to cancel each other. Additionally, the range of the collector current of the transistor $Q_4$ is restricted due to its connection to the constant current source $S_1$, with the result that the transistor $Q_4$ is not saturated. The carrier storage time in transistor $Q_4$ is reduced, thereby causing the change of the carrier storage time with temperature to be very small or negligible.

The monostable multivibrator according to FIG. 3 is designed such that, in the stationary state, the transistors $Q_1$, $Q_2$ and $Q_5$ are turned off while the transistors $Q_4$, $Q_6$ and $Q_7$ are turned on.

When a positive trigger pulse is applied to the base of the transistor $Q_1$, the transistor $Q_1$ is switched on, causing its collector potential to drop. As a result the base potential of the transistor $Q_4$ drops, thereby switching transistors $Q_4$ and $Q_6$ to the off state. The turning-off of the transistor $Q_4$, in turn, causes the transistors $Q_2$ and $Q_5$ to be switched on. In this manner, the state of the monostable multivibrator is changed from its stable state to its unstable state. When the transistor $Q_2$ is turned on, the stored charge in the capacitor C begins to discharge through the resistor $R_1$ and the collector-emitter circuit of the transistor $Q_2$. As a result, the base potential of the transistor $Q_4$ increases according to the time constant determined by the resistor $R_1$ and the capacitor C. When the base potential of the transistor $Q_4$ reaches the threshold level, the transistor $Q_4$ is again turned on. When transistor $Q_4$ switches on, its collector potential *drops*, which, in turn, causes the transistor $Q_2$ to turn off. At the same time, the transistor $Q_6$ is turned on and the capacitor C is rapidly charged through a path including the resistor $R_1$, and the collector-emitter circuit [including] *of* the transistor $Q_6$, with the result that the monostable multivibrator is instantaneously restored from its unstable state to its stable state. FIG. [4(A)] *4(B)* shows a waveform corresponding to the base potential of the transistor $Q_4$ *when* the circuit of FIG. 3 operates as just described.

In the circuit of FIG. 3, a resistor $R_{11}$ (not shown) may be connected between the base of the transistor $Q_4$ and the −B power source, in lieu of the transistor $Q_6$. If this were done the capacitor C would then be charged through the combination of the resistors $R_1$, $R_{11}$, and $R_{10}$, when the monostable multivibrator is restored from the unstable state to the stable state, and the restoring time would depend on the time constant determined by the resistors $R_1$, $R_{11}$ and $R_{10}$, and the capacitor C. The result would be an elongation of the restoring time from the unstable to the stable state, as shown in FIG. [4(B)] *4(A)* which illustrates the base potential waveform of the transistor $Q_4$ for such a case. In contrast, with the circuit of FIG. 3, the emitter follower transistor $Q_6$ is used as the base-bias circuit of the transistor $Q_4$ and thus the charging current to the capacitor C flows through the collector-emitter circuit of the transistor $Q_6$. Due to this arrangement, the restoring time from the unstable state to the stable state can be very rapid. Therefore, if the repetition rate of the triggering pulses is increased, the monostable multivibrator of FIG. 3 is able to accurately follow the triggering pulses, and at the same time provide fixed pulse width output pulses.

As mentioned above, the monostable multivibrator of [the invention] *the present invention* includes the gate circuit, the time constant circuit and the inverter circuit. The inverter circuit comprises a differential amplifier. An emitter follower transistor is used for the input bias circuit of the inverter. With such an arrangement, the threshold level of the inverter and the time delay due to the carrier storage time are substantially independent of any temperature change. Further, the restoring time from the unstable state is reduced with the result that the pulse width of the output pulse may be kept constant. Consequently, if the monostable multivibrator of the invention is applied to pulse count FM demodulation circuit, the variation in the DC detector output is minimized or prevented, thereby eliminating signal distortion due to incorrect tuning using the tuning meter.

Various other modifications of the disclosed embodiment will become apparent to persons skilled in the art without departing from the spirit and scope of the invention as defined by the appended claims.

What is claimed is:

1. In a monostable multivibrator having a gate circuit, a time constant circuit connected to the gate circuit, and an inverter circuit, the improvement wherein said inverter circuit comprises a differential amplifier having two inputs and having an input bias circuit including a pair of transistors each biased connected as an emitter follower, the emitters of said pair of transistors connected are each to respective inputs of said differential amplifier, the bases of said transistors respectively connected to first and second bias means, and the emitter of one of said transistors additionally connected to the time constant circuit.

2. An improved monostable multivibrator according to claim 1 wherein said differential amplifier comprises a pair of transistors, the collectors of which are adapted to be connected to the positive side of a power source, and the emitters of which are connected to each other and adapted to be connected to the negative side of a power source through a constant current source.

3. A monostable multivibrator comprising;

a gate circuit;

a time constant circuit including a capacitor and a resistor, said capacitor being connected at one end to said gate circuit and at the other end to one end of said resistor, the other end of which is adapted to be operably connected to the positive side of a power source;

an inverter circuit including first, second, third, and fourth transistors, the collectors of said first and second transistors being adapted to be operably connected to the positive side of a power source, the emitters of said first and second transistors being connected to each other and being adapted to be operably connected to the negative side of a power source, said third and fourth transistors being connected in emitter follower circuit arrangements, the collector of said first transistor also being operably connected to said gate circuit and to a first output terminal, the base of said first transistor being connected to the emitter of said third transistor, the collector of said third transistor being adapted to be connected to the negative side of a power source, the emitter of said third transistor also being connected to the connection point between said capacitor and said resistor, the collector of said second transistor being connected to a second output terminal and the base of said second transistor being connected to the emitter of said fourth transistor, and the collector of said fourth transistor being adapted to be connected to the negative side of a power source; and first and second bias means, the base of said third transistor being connected to said first bias means, and the base of said fourth transistor being connected to said second bias means.

4. The monostable multivibrator according to claim 3 wherein the emitters of said first and second transistors are connected to the negative side of a power source through a constant current source.

5. The monostable multivibrator according to claim 3, wherein said gate circuit includes a pair of transistors, the collectors of which are connected to each other and to one end of said capacitor, and are adapted to be operably connected to the positive side of a power source the emitters of which are connected to each other and to ground, the base of one of said gate circuit transistors is connected to an input terminal, and the base of the other of said gate circuit transistors is operatively connected to the collector of said first transistor of said inverter circuit.

6. A monostable multivibrator according to claim 3 wherein said first and second bias means each comprise a resistance connected between the negative side of a power source and ground.

7. A monostable multivibrator according to claim 3 wherein the output from multivibrator is provided from either said first or second output terminal.

* * * * *